United States Patent
Yeh et al.

(10) Patent No.: US 11,271,099 B2
(45) Date of Patent: Mar. 8, 2022

(54) VERTICAL BIPOLAR TRANSISTOR DEVICE

(71) Applicant: AMAZING MICROELECTRONIC CORP., New Taipei (TW)

(72) Inventors: Chih-Ting Yeh, Hsinchu County (TW); Sung-Chih Huang, Yilan County (TW); Che-Hao Chuang, Hsinchu County (TW)

(73) Assignee: Amazing Microelectronic Corp., New Taipei (TW)

( * ) Notice: Subject to any disclaimer, the term of this patent is extended or adjusted under 35 U.S.C. 154(b) by 107 days.

(21) Appl. No.: 16/940,750

(22) Filed: Jul. 28, 2020

(65) Prior Publication Data

US 2022/0037512 A1 Feb. 3, 2022

(51) Int. Cl.
*H01L 29/732* (2006.01)
*H01L 27/02* (2006.01)

(52) U.S. Cl.
CPC ........ *H01L 29/732* (2013.01); *H01L 27/0248* (2013.01)

(58) Field of Classification Search
CPC ................ H01L 29/732–7327; H01L 27/0248
See application file for complete search history.

(56) References Cited

U.S. PATENT DOCUMENTS

| | | |
|---|---|---|
| 7,750,365 B2 | 7/2010 | Takahashi et al. |
| 7,781,826 B2 | 8/2010 | Mallikararjunaswamy et al. |
| 8,928,084 B2 | 1/2015 | Renaud et al. |
| 9,666,700 B2 | 5/2017 | Hebert et al. |
| 2010/0200912 A1* | 8/2010 | Hsieh ................ H01L 29/66727 257/329 |
| 2012/0018778 A1* | 1/2012 | Chen .................... H01L 27/0259 257/173 |
| 2012/0025350 A1* | 2/2012 | Lin ...................... H01L 27/0259 257/546 |
| 2012/0068299 A1* | 3/2012 | Lin ...................... H01L 27/0259 257/510 |
| 2018/0006013 A1* | 1/2018 | Lin ....................... H01L 29/866 |

* cited by examiner

*Primary Examiner* — Khaja Ahmad
*Assistant Examiner* — Pavel G Ivanov
(74) *Attorney, Agent, or Firm* — Rosenberg, Klein & Lee (57) ABSTRACT

A vertical bipolar transistor device is disclosed. The vertical bipolar transistor device includes a heavily-doped semiconductor substrate, a first semiconductor epitaxial layer, at least one first doped well, and an external conductor. The heavily-doped semiconductor substrate and the first doped well have a first conductivity type. The first semiconductor epitaxial layer has a second conductivity type. The first semiconductor epitaxial layer is formed on the heavily-doped semiconductor substrate. The first doped well is formed in the first semiconductor epitaxial layer. The external conductor is arranged outside the heavily-doped semiconductor substrate and the first semiconductor epitaxial layer and electrically connected to the heavily-doped semiconductor substrate and the first semiconductor epitaxial layer.

13 Claims, 11 Drawing Sheets

VERTICAL BIPOLAR TRANSISTOR DEVICE

BACKGROUND OF THE INVENTION

Field of the Invention

The present invention relates to the vertical electrostatic discharge (ESD) technology, particularly to a vertical bipolar transistor device.

Description of the Related Art

Electrostatic Discharge (ESD) damage has become the main reliability issue for CMOS IC products fabricated in the nanoscale CMOS processes. ESD protection device is generally designed to bypass the ESD energy, so that the IC chips can be prevented from ESD damages.

Figure 1:
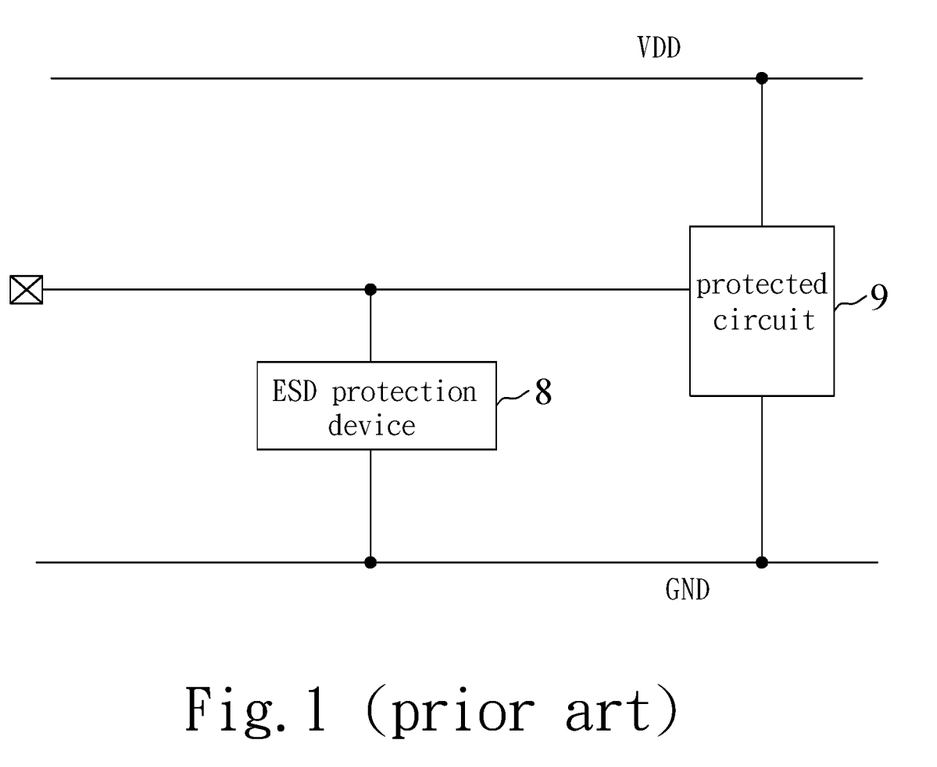
FIG. 1 is a schematic diagram illustrating an ESD protection device connected with a protected circuit on an IC chip in the conventional technology.

The working principle of ESD protection device is shown in FIG. 1. In FIG. 1, the ESD protection device 8 is connected in parallel with a protected circuit 9 on the IC chip. The ESD protection device 8 would be triggered immediately when the ESD event occurs. In that way, the ESD protection device 8 can provide a superiorly low resistance path for discharging the transient ESD current, so that the energy of the ESD transient current can be bypassed by the ESD protection device 8. For the purpose of reducing the size and surface areas occupied by the ESD protection device 8, a vertical transient voltage suppressor is implemented instead of a lateral transient voltage suppressor. For example, in the U.S. Pat. No. 8,928,084, a lateral ESD protection device is fabricated in an epitaxial layer and electrodes are formed on the surface of the ESD protection device. Thus, the electrodes occupy many footprint areas. In the U.S. Pat. No. 9,666,700, electrodes that are formed on the surface of the ESD protection device also occupy many footprint areas. On top of that, the conventional vertical transient voltage suppressor has some drawbacks. In the U.S. Pat. No. 7,750,365, an implant process needs to be implemented on the bottom of the insulated gate bipolar transistor although the insulated gate bipolar transistor is a vertical transient voltage suppressor. In the U.S. Pat. No. 7,781,826, the substrate and the epitaxial layer belong to the same conductivity type. Besides, the P-type well is used as the base of the BJT. The breakdown interface is formed between the P-type well and the epitaxial layer. The breakdown voltage of the interface is difficultly controlled since the depth of the P-type well depends on the width of the base.

To overcome the abovementioned problems, the present invention provides a vertical bipolar transistor device, so as to solve the afore-mentioned problems of the prior art.

SUMMARY OF THE INVENTION

The present invention provides a vertical bipolar transistor device, which freely adjusts the gain and the breakdown voltage of a bipolar junction transistor.

In an embodiment of the present invention, a vertical bipolar transistor device is provided. The vertical bipolar transistor device includes a heavily-doped semiconductor substrate, a first semiconductor epitaxial layer, at least one first doped well, and an external conductor. The heavily-doped semiconductor substrate has a first conductivity type. The first semiconductor epitaxial layer has a second conductivity type. The first semiconductor epitaxial layer is formed on the heavily-doped semiconductor substrate. The first doped well has the first conductivity type. The first doped well is formed in the first semiconductor epitaxial layer. The external conductor is arranged outside the heavily-doped semiconductor substrate and the first semiconductor epitaxial layer and electrically connected to the heavily-doped semiconductor substrate and the first semiconductor epitaxial layer.

In an embodiment of the present invention, the first conductivity type is an N type and the second conductivity type is a P type.

In an embodiment of the present invention, the first conductivity type is a P type and the second conductivity type is an N type.

In an embodiment of the present invention, the vertical bipolar transistor device further includes at least one first heavily-doped area and a second heavily-doped area. The first heavily-doped area has the first conductivity type. The first heavily-doped area is formed in the first doped well. The second heavily-doped area has the second conductivity type. The second heavily-doped area is formed in the first semiconductor epitaxial layer. The second heavily-doped area surrounds the first doped well.

In an embodiment of the present invention, the vertical bipolar transistor device further includes a heavily-doped buried layer formed between the heavily-doped semiconductor substrate and the first semiconductor epitaxial layer and under the first doped well.

In an embodiment of the present invention, the first doped well comprises a plurality of first doped wells, the first heavily-doped area comprises a plurality of first heavily-doped areas, and the plurality of first heavily-doped areas are respectively formed in the plurality of first doped wells.

In an embodiment of the present invention, the vertical bipolar transistor device further includes an isolation structure formed in the first semiconductor epitaxial layer and between the first doped well and the second heavily-doped area, the isolation structure surrounds the first doped well, and the bottom of the isolation structure is equal to or lower than that of the first doped well.

In an embodiment of the present invention, the vertical bipolar transistor device further includes a second doped well formed in the first semiconductor epitaxial layer and between the first doped well and the second heavily-doped area, the second doped well has the first conductivity type, the second doped well surrounds the first doped well, and the bottom of the second doped well is equal to or lower than that of the first doped well.

In an embodiment of the present invention, the first doped well is electrically connected a first pin and the heavily-doped semiconductor substrate, the external conductor, and the first semiconductor epitaxial layer are electrically connected to a second pin.

In an embodiment of the present invention, the external conductor comprises a leadframe and welding wires.

In an embodiment of the present invention, the vertical bipolar transistor device further includes a second semiconductor epitaxial layer formed between the heavily-doped semiconductor substrate and the first semiconductor epitaxial layer and under the at least one first doped well, and doping concentration of the second semiconductor epitaxial layer is higher than doping concentration of the first semiconductor epitaxial layer.

In an embodiment of the present invention, the vertical bipolar transistor device further includes an isolation structure formed in the first semiconductor epitaxial layer and between the at least one first doped well and the second heavily-doped area, the isolation structure surrounds the at least one first doped well, and a bottom of the isolation structure is equal to or lower than that of the at least one first doped well.

In an embodiment of the present invention, the isolation structure is formed in the second semiconductor epitaxial layer.

To sum up, the vertical bipolar transistor device can freely adjust the gain and the breakdown voltage of a bipolar junction transistor based on the resistivity and the thickness of the first semiconductor epitaxial layer. The vertical bipolar transistor device may have a larger range of the breakdown voltage based on the resistivity of the first semiconductor epitaxial layer and the heavily-doped buried layer.

Below, the embodiments are described in detail in cooperation with the drawings to make easily understood the technical contents, characteristics and accomplishments of the present invention.

DETAILED DESCRIPTION OF THE INVENTION

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the present invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to encompass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

For the purpose of reducing the surface areas occupied by the ESD protection device, enhancing the ESD level without increasing the areas occupied by the ESD protection device, and achieving uniform current distribution and good heat dissipation, a vertical bipolar transistor device is provided.

Figure 2:
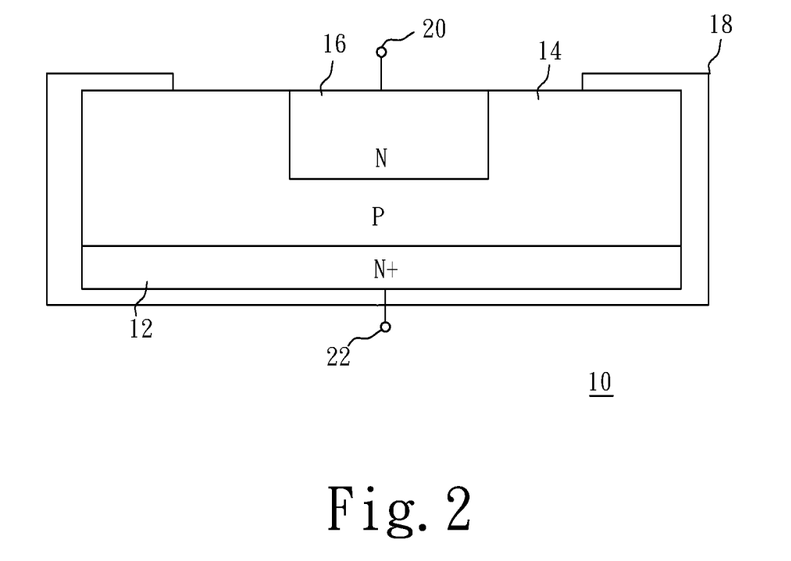
FIG. 2 is a cross-sectional view of a vertical bipolar transistor device according to the first embodiment of the present invention.

FIG. 2 is a cross-sectional view of a vertical bipolar transistor device according to the first embodiment of the present invention. Referring to FIG. 2, the first embodiment of the vertical bipolar transistor device 10 includes a heavily-doped semiconductor substrate 12, a first semiconductor epitaxial layer 14, at least one first doped well 16, and an external conductor 18. The first doped well 16 may have a shape of a cuboid, but the present invention is not limited thereto. In the first embodiment, one or more first doped wells 16 can be used. The first embodiment exemplifies one first doped well 16 for clarity and convenience. The heavily-doped semiconductor substrate 12 and the first doped well 16 have a first conductivity type, and the first semiconductor epitaxial layer 14 has a second conductivity type. In the first embodiment, the first conductivity type is an N type and the second conductivity type is a P type.

The first semiconductor epitaxial layer 14 is formed on the heavily-doped semiconductor substrate 12. The first doped well 16 is formed in the first semiconductor epitaxial layer 14. The heavily-doped semiconductor substrate 12, the first semiconductor epitaxial layer 14, and the first doped well 16 form a bipolar junction transistor (BJT), wherein the first semiconductor epitaxial layer 14 is used as the base of the BJT. The gain and the breakdown voltage of the BJT are freely adjusted based on the resistivity and the thickness of the epitaxial layer 14 since the resistivity and the thickness of the epitaxial layer 14 are easily adjusted. The external conductor 18 is arranged outside the heavily-doped semiconductor substrate 12 and the first semiconductor epitaxial layer 14 and electrically connected to the heavily-doped semiconductor substrate 12 and the first semiconductor epitaxial layer 14. The external conductor 18 includes, but not limited to, a leadframe and welding wires. For example, the external conductor 18 may be a conductive layer formed on the outside of the heavily-doped semiconductor substrate 12 and the first semiconductor epitaxial layer 14. Specifically, the conductive layer is formed on the top and the sidewall of the first semiconductor epitaxial layer 14 and the sidewall and the bottom of the heavily-doped semiconductor substrate 12. The first doped well 16 is electrically connected a first pin 20. The heavily-doped semiconductor substrate 12, the external conductor 18, and the first semiconductor epitaxial layer 14 are electrically connected to a second pin 22.

When positive ESD energy is applied to the first pin 20 and the second pin 22 is grounded, the ESD current flows from the first pin 20 to the second pin 22 through the first doped well 16, the first semiconductor epitaxial layer 14, and the heavily-doped semiconductor substrate 12. Since the first semiconductor epitaxial layer 14 and the heavily-doped semiconductor substrate 12 have the same voltage due to the external conductor 18, the electric field is uniformly distributed on the entire breakdown interface between the first doped well 16 and the first semiconductor epitaxial layer 14, which reduces the current crowding effect occurring at the corner of the first doped well 16.

Figure 3:
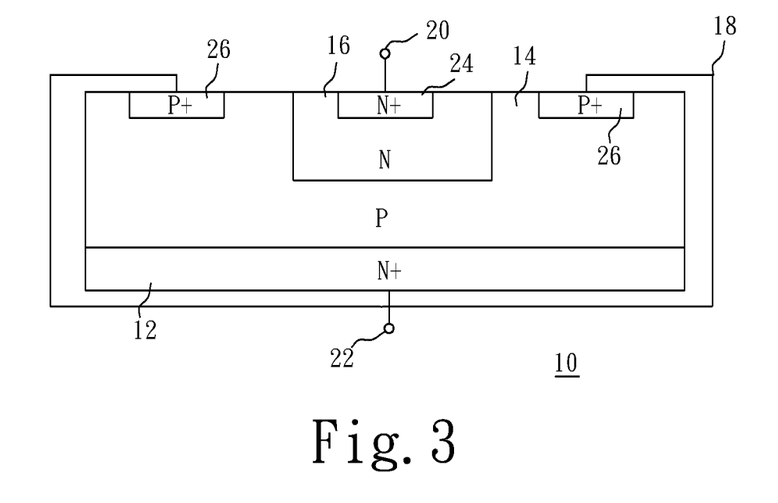
FIG. 3 is a cross-sectional view of a vertical bipolar transistor device according to the second embodiment of the present invention.

FIG. 3 is a cross-sectional view of a vertical bipolar transistor device according to the second embodiment of the present invention. Referring to FIG. 3, the second embodiment of the vertical bipolar transistor device 10 is introduced as follows. Compared with the first embodiment, the second embodiment further includes at least one first heavily-doped area 24 and a second heavily-doped area 26. The second embodiment uses one or more first heavily-doped areas 24 and exemplifies one first heavily-doped area 24. The first heavily-doped area 24 has the first conductivity type. The second heavily-doped area 26 has the second conductivity type. The first heavily-doped area 24 is formed in the first doped well 16. The second heavily-doped area 26 is formed in the first semiconductor epitaxial layer 14. The second heavily-doped area 26 surrounds the first doped well 16. The first doped well 16 is electrically connected to the first pin 20 through the first heavily-doped area 24. The first semiconductor epitaxial layer 14 is electrically connected to the second pin 22 through the second heavily-doped area 26. If the external conductor 18 is implemented with a conductive layer, the conductive layer may be formed on the top of the second heavily-doped area 26. The first heavily-doped area 24 and the second heavily-doped area 26 are respectively used as ohmic contacts of the first doped well 16 and the first semiconductor epitaxial layer 14 and used to decrease the resistance between the first pin 20 and the first doped well 16 and the resistance between the external conductor 18 and the first semiconductor epitaxial layer 14.

When positive ESD energy is applied to the first pin 20 and the second pin 22 is grounded, the ESD current flows from the first pin 20 to the second pin 22 through the first heavily-doped area 24, the first doped well 16, the first semiconductor epitaxial layer 14, and the heavily-doped semiconductor substrate 12. Since the second heavily-doped area 26, the first semiconductor epitaxial layer 14 and the heavily-doped semiconductor substrate 12 have the same voltage due to the external conductor 18, the electric field is uniformly distributed on the entire breakdown interface between the first doped well 16 and the first semiconductor epitaxial layer 14, which reduces the current crowding effect occurring at the corner of the first doped well 16.

Figure 4:
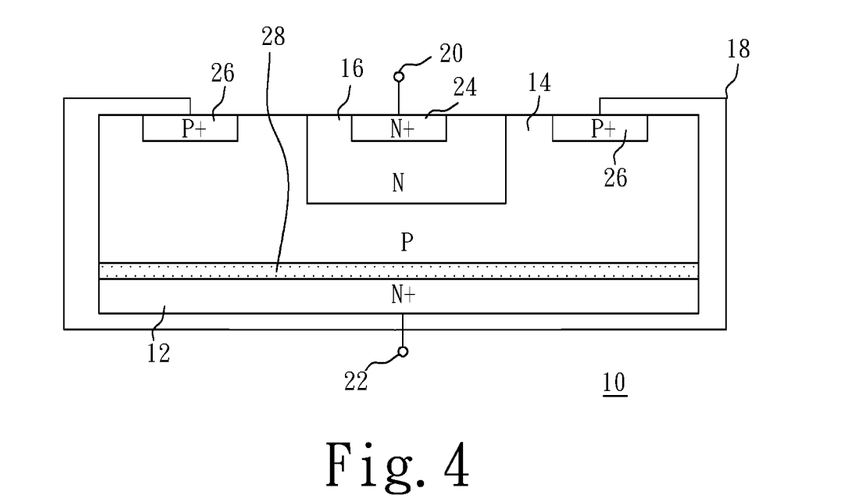
FIG. 4 is a cross-sectional view of a vertical bipolar transistor device according to the third embodiment of the present invention.

FIG. 4 is a cross-sectional view of a vertical bipolar transistor device according to the third embodiment of the present invention. Referring to FIG. 4, the third embodiment of the vertical bipolar transistor device 10 is introduced as follows. Compared with the second embodiment, the third embodiment further includes a heavily-doped buried layer 28 formed between the heavily-doped semiconductor substrate 12 and the first semiconductor epitaxial layer 14 and under the first doped well 16. The heavily-doped buried layer 28 is used when positive ESD energy is applied to the second pin 22 and the first pin 20 is grounded. The heavily-doped buried layer 28 has the first conductivity type or the second conductivity type. When the heavily-doped buried layer 28 has the first conductivity type, the breakdown interface is formed between the heavily-doped buried layer 28 and the first semiconductor epitaxial layer 14. Although the heavily-doped buried layer 28 and the heavily-doped semiconductor substrate 12 belong to the same conductivity type, the free energy of ions of the heavily-doped buried layer 28 is usually higher than the free energy of ions of the heavily-doped semiconductor substrate 12 due to a fact that the heavily-doped buried layer 28 and the heavily-doped semiconductor substrate 12 are doped with different materials. For example, the heavily-doped buried layer 28 is doped with phosphorous atoms and the heavily-doped semiconductor substrate 12 is doped with arsenic atoms. Thus, the breakdown voltage of an interface between the heavily-doped buried layer 28 and the first semiconductor epitaxial layer 14 is usually lower than the breakdown voltage of an interface between the first semiconductor epitaxial layer 14 and the heavily-doped semiconductor substrate 12. When the heavily-doped buried layer 28 has the second conductivity type, the breakdown interface is formed between the heavily-doped buried layer 28 and the heavily-doped semiconductor substrate 12. The vertical bipolar transistor device 10 may have a larger range of the breakdown voltage based on the resistivity of the first semiconductor epitaxial layer 14 and the heavily-doped buried layer 28.

When positive ESD energy is applied to the first pin 20 and the second pin 22 is grounded, the ESD current flows from the first pin 20 to the second pin 22 through the first heavily-doped area 24, the first doped well 16, the first semiconductor epitaxial layer 14, the heavily-doped buried layer 28, and the heavily-doped semiconductor substrate 12. Since the second heavily-doped area 26, the first semiconductor epitaxial layer 14 and the heavily-doped semiconductor substrate 12 have the same voltage due to the external conductor 18, the electric field is uniformly distributed on the entire breakdown interface between the first doped well 16 and the first semiconductor epitaxial layer 14, which reduces the current crowding effect occurring at the corner of the first doped well 16.

When positive ESD energy is applied to the second pin 22 and the first pin 20 is grounded, two ESD current flows from the second pin 22 to the first pin 20 to enhance the ESD level. One ESD current flows from the second pin 22 to the first pin 20 through the heavily-doped semiconductor substrate 12, the heavily-doped buried layer 28, the first semiconductor epitaxial layer 14, the first doped well 16, and the first heavily-doped area 24. The other ESD current flows from the second pin 22 to the first pin 20 through the external conductor 18, the second heavily-doped area 26, the first semiconductor epitaxial layer 14, the first doped well 16, and the first heavily-doped area 24.

Figure 5:
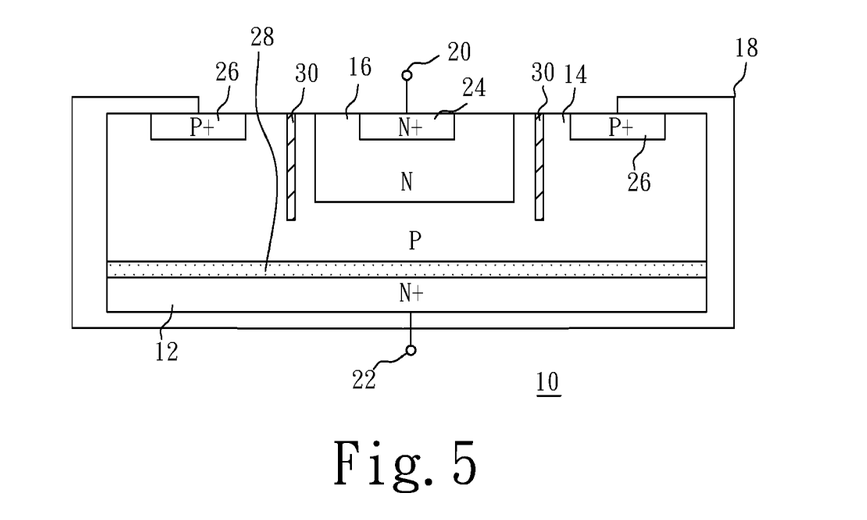
FIG. 5 is a cross-sectional view of a vertical bipolar transistor device according to the fourth embodiment of the present invention.

FIG. 5 is a cross-sectional view of a vertical bipolar transistor device according to the fourth embodiment of the present invention. Referring to FIG. 5, the fourth embodiment of the vertical bipolar transistor device 10 is introduced as follows. Compared with the third embodiment, the fourth embodiment further includes an isolation structure 30 formed in the first semiconductor epitaxial layer 14 and between the first doped well 16 and the second heavily-doped area 26. For example, the isolation structure 30 includes, but not limited to, oxide or other insulator. For achieving good heat dissipation, the isolation structure 30 is used to prevent the ESD current from flowing along the top surface of the first semiconductor epitaxial layer 14 when positive ESD energy is applied to the second pin 22 and the first pin 20 is grounded. When the positive ESD energy is applied to the second pin 22 and the first pin 20 is grounded, the ESD current flows under the isolation structure 30. As a result, the bottom of the isolation structure 30 is equal to or lower than that of the first doped well 16. In addition, the isolation structure 30 surrounds the first doped well 16. Thus, the ESD current is confined in a space surrounded by the isolation structure 30 when the positive ESD energy is applied to the first pin 20 and the second pin 22 is grounded.

Figure 6:
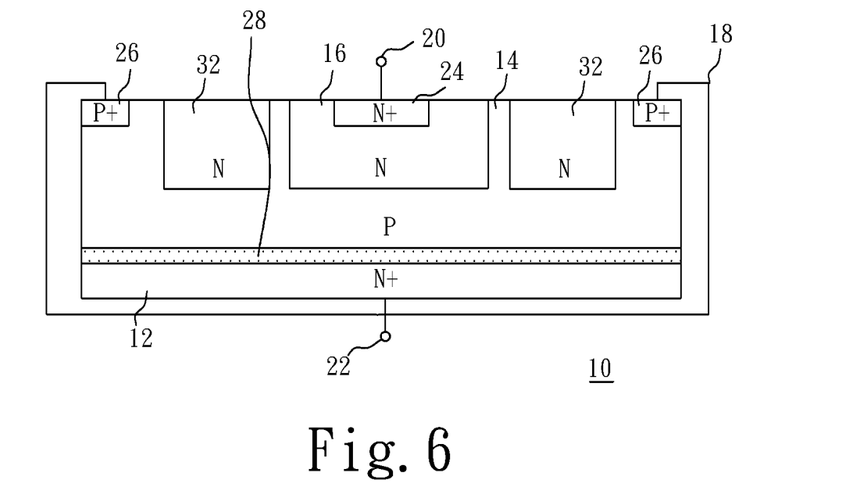
FIG. 6 is a cross-sectional view of a vertical bipolar transistor device according to the fifth embodiment of the present invention.

FIG. 6 is a cross-sectional view of a vertical bipolar transistor device according to the fifth embodiment of the present invention. Referring to FIG. 6, the fifth embodiment of the vertical bipolar transistor device 10 is introduced as follows. Compared with the third embodiment, the fifth embodiment further includes a second doped well 32 formed in the first semiconductor epitaxial layer 14 and between the first doped well 16 and the second heavily-doped area 26. The second doped well 32 has the first conductivity type. For achieving good heat dissipation, the second doped well 32 is used to prevent the ESD current from flowing along the top surface of the first semiconductor epitaxial layer 14 when positive ESD energy is applied to the second pin 22 and the first pin 20 is grounded. When the positive ESD energy is applied to the second pin 22 and the first pin 20 is grounded, the ESD current flows under the second doped well 32. As a result, the bottom of the second doped well 32 is equal to or lower than that of the first doped well 16. In addition, the second doped well 32 surrounds the first doped well 16. Thus, the ESD current is confined in a space surrounded by the second doped well 32 when the positive ESD energy is applied to the first pin 20 and the second pin 22 is grounded.

Figure 7:
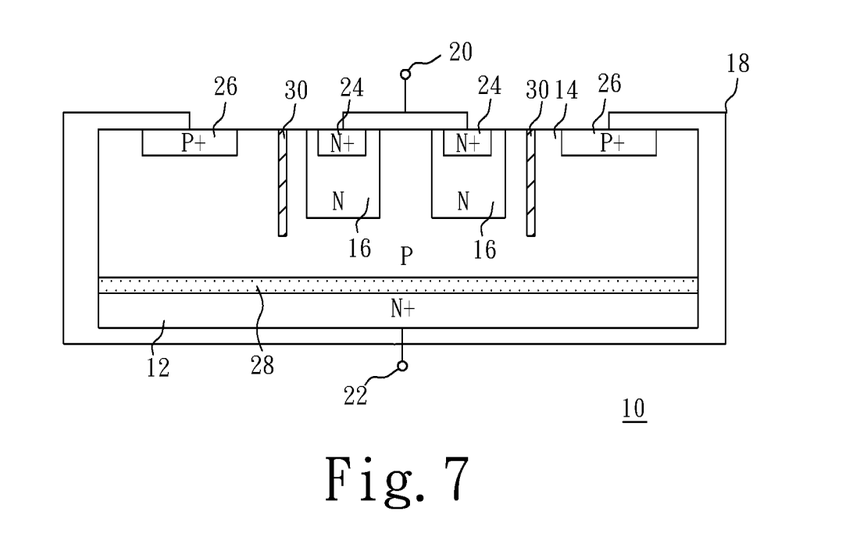
FIG. 7 is a cross-sectional view of a vertical bipolar transistor device according to the sixth embodiment of the present invention.

FIG. 7 is a cross-sectional view of a vertical bipolar transistor device according to the sixth embodiment of the present invention. Referring to FIG. 7, the sixth embodiment of the vertical bipolar transistor device 10 is introduced as follows. The sixth embodiment is different from the fourth embodiment in the numbers of the first doped well 16 and the first heavily-doped area 24. The sixth embodiment exemplifies a plurality of first doped wells 16 and a plurality of first heavily-doped areas 24. The first heavily-doped areas 24 are respectively formed in the first doped wells 16 and electrically connected to the first pin 20. The more the numbers of the first doped well 16 and the first heavily-doped area 24 surrounded by the isolation structure 30, the higher the ESD level. On top of that, the first doped wells 16 may be arranged into an array to enhance the uniformity of the ESD current. As a result, the sixth embodiment can greatly enhance the ESD level and the uniformity of the ESD current within a space surrounded by the isolation structure 30.

Figure 8:
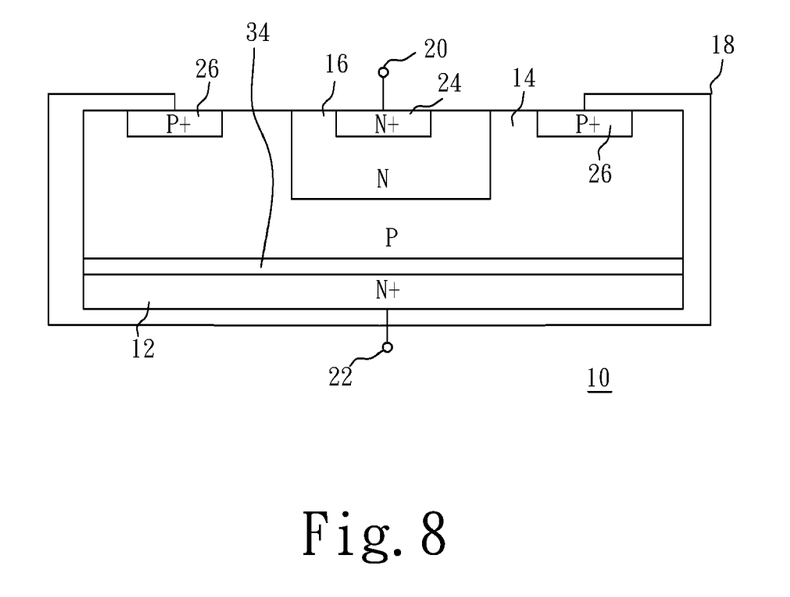
FIG. 8 is a cross-sectional view of a vertical bipolar transistor device according to the seventh embodiment of the present invention.

FIG. 8 is a cross-sectional view of a vertical bipolar transistor device according to the seventh embodiment of the present invention. Referring to FIG. 8, the seventh embodiment of the vertical bipolar transistor device 10 is introduced as follows. Compared with the second embodiment, the seventh embodiment further includes a second semiconductor epitaxial layer 34 formed between the heavily-doped semiconductor substrate 12 and the first semiconductor epitaxial layer 14 and under the first doped well 16. The doping concentration of the second semiconductor epitaxial layer 34 is higher than that of the second semiconductor epitaxial layer 34. The second semiconductor epitaxial layer 34 has the first conductivity type or the second conductivity type. When the second semiconductor epitaxial layer 34 has the first conductivity type, the breakdown interface is formed between the second semiconductor epitaxial layer 34 and the first semiconductor epitaxial layer 14. Although the second semiconductor epitaxial layer 34 and the heavily-doped semiconductor substrate 12 belong to the same conductivity type, the free energy of ions of the second semiconductor epitaxial layer 34 is usually higher than the free energy of ions of the heavily-doped semiconductor substrate 12 due to a fact that the second semiconductor epitaxial layer 34 and the heavily-doped semiconductor substrate 12 are doped with different materials. For example, the second semiconductor epitaxial layer 34 is doped with phosphorous atoms and the heavily-doped semiconductor substrate 12 is doped with arsenic atoms. Thus, the breakdown voltage of an interface between the second semiconductor epitaxial layer 34 and the first semiconductor epitaxial layer 14 is usually lower than the breakdown voltage of an interface between the first semiconductor epitaxial layer 14 and the heavily-doped semiconductor substrate 12. When the second semiconductor epitaxial layer 34 has the second conductivity type, the breakdown interface is formed between the second semiconductor epitaxial layer 34 and the heavily-doped semiconductor substrate 12. The vertical bipolar transistor device 10 may have a larger range of the breakdown voltage based on the resistivity of the first semiconductor epitaxial layer 14 and the second semiconductor epitaxial layer 34.

When positive ESD energy is applied to the first pin 20 and the second pin 22 is grounded, the ESD current flows from the first pin 20 to the second pin 22 through the first heavily-doped area 24, the first doped well 16, the first semiconductor epitaxial layer 14, the second semiconductor epitaxial layer 34, and the heavily-doped semiconductor substrate 12. Since the second heavily-doped area 26, the first semiconductor epitaxial layer 14 and the heavily-doped semiconductor substrate 12 have the same voltage due to the external conductor 18, the electric field is uniformly distributed on the entire breakdown interface between the first doped well 16 and the first semiconductor epitaxial layer 14, which reduces the current crowding effect occurring at the corner of the first doped well 16. The second semiconductor epitaxial layer 34 can increase the width and the concentration of the base of the BJT, thereby reducing the β gain of the BJT.

When positive ESD energy is applied to the second pin 22 and the first pin 20 is grounded, two ESD current flows from the second pin 22 to the first pin 20 to enhance the ESD level. One ESD current flows from the second pin 22 to the first pin 20 through the heavily-doped semiconductor substrate 12, the second semiconductor epitaxial layer 34, the first semiconductor epitaxial layer 14, the first doped well 16, and the first heavily-doped area 24. The other ESD current flows from the second pin 22 to the first pin 20 through the external conductor 18, the second heavily-doped area 26, the first semiconductor epitaxial layer 14, the first doped well 16, and the first heavily-doped area 24.

Figure 9:
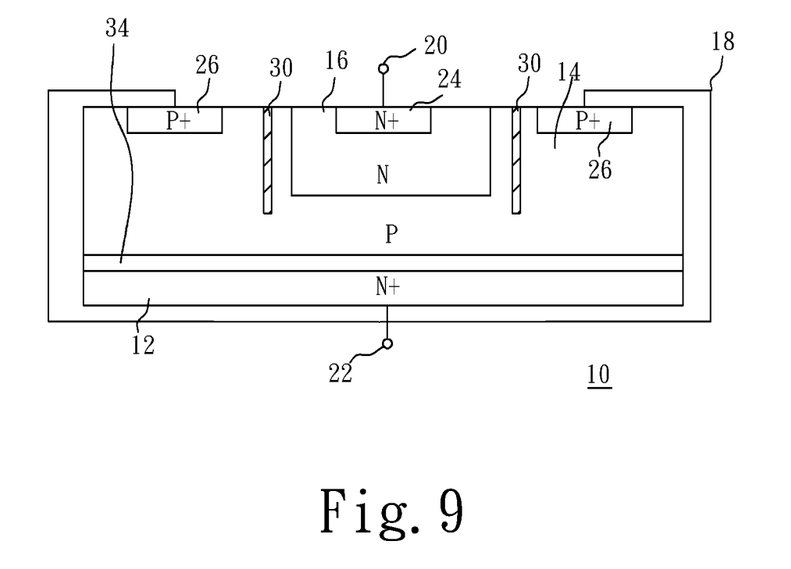
FIG. 9 is a cross-sectional view of a vertical bipolar transistor device according to the eighth embodiment of the present invention.

FIG. 9 is a cross-sectional view of a vertical bipolar transistor device according to the eighth embodiment of the present invention. Referring to FIG. 9, the eighth embodiment of the vertical bipolar transistor device 10 is introduced as follows. Compared with the seventh embodiment, the eighth embodiment further includes an isolation structure 30 formed in the first semiconductor epitaxial layer 14 and between the first doped well 16 and the second heavily-doped area 26. For example, the isolation structure 30 includes, but not limited to, oxide or other insulator. For achieving good heat dissipation, the isolation structure 30 is used to prevent the ESD current from flowing along the top surface of the first semiconductor epitaxial layer 14 when positive ESD energy is applied to the second pin 22 and the first pin 20 is grounded. When the positive ESD energy is applied to the second pin 22 and the first pin 20 is grounded, the ESD current flows under the isolation structure 30. As a result, the bottom of the isolation structure 30 is equal to or lower than that of the first doped well 16. In addition, the isolation structure 30 surrounds the first doped well 16. Thus, the ESD current is confined in a space surrounded by the isolation structure 30 when the positive ESD energy is applied to the first pin 20 and the second pin 22 is grounded.

Figure 10:
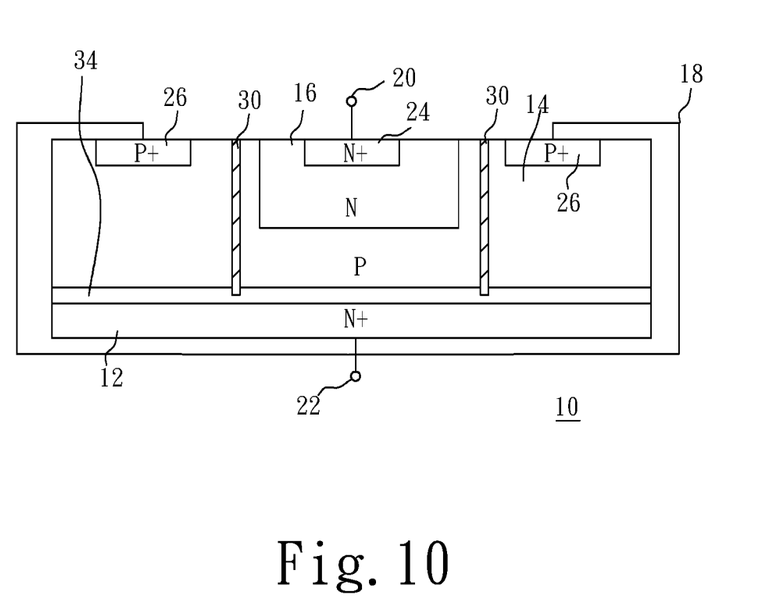
FIG. 10 is a cross-sectional view of a vertical bipolar transistor device according to the ninth embodiment of the present invention.

FIG. 10 is a cross-sectional view of a vertical bipolar transistor device according to the ninth embodiment of the present invention. Referring to FIG. 10, the ninth embodiment of the vertical bipolar transistor device 10 is introduced as follows. Compared with the eighth embodiment, the isolation structure 30 of the ninth embodiment is formed in the second semiconductor epitaxial layer 34.

Figure 11:
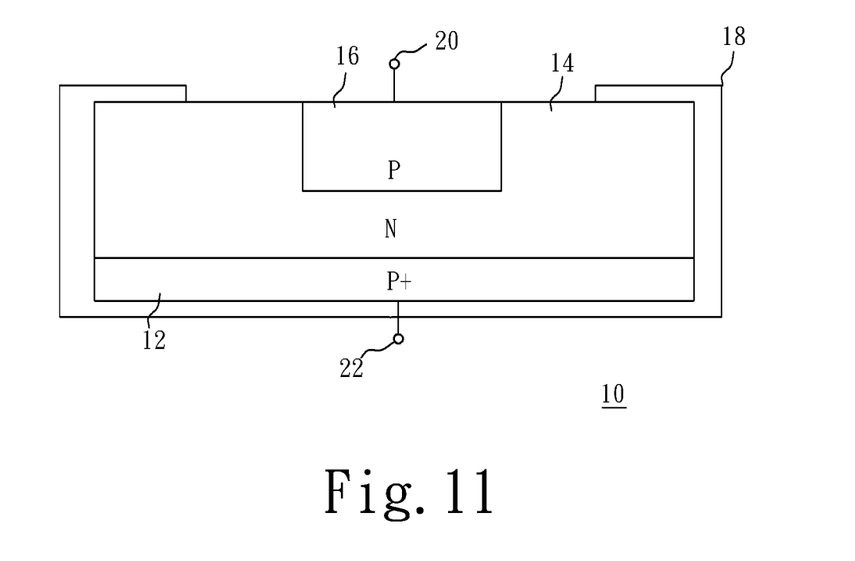
FIG. 11 is a cross-sectional view of a vertical bipolar transistor device according to the tenth embodiment of the present invention.

FIG. 11 is a cross-sectional view of a vertical bipolar transistor device according to the tenth embodiment of the present invention. The tenth embodiment is different from the first embodiment in the conductivity types. The first conductivity type and the second conductivity type of the tenth embodiment are respectively a P type and an N type. The other structures of the tenth embodiment have been described in the first embodiment so will not be reiterated.

When positive ESD energy is applied to the second pin 22 and the first pin 20 is grounded, the ESD current flows from the second pin 22 to the first pin 20 through the heavily-doped semiconductor substrate 12, the first semiconductor epitaxial layer 14, and the first doped well 16. Since the first semiconductor epitaxial layer 14 and the heavily-doped semiconductor substrate 12 have the same voltage due to the external conductor 18, the electric field is uniformly distributed on the entire breakdown interface between the first doped well 16 and the first semiconductor epitaxial layer 14, which reduces the current crowding effect occurring at the corner of the first doped well 16.

Figure 12:
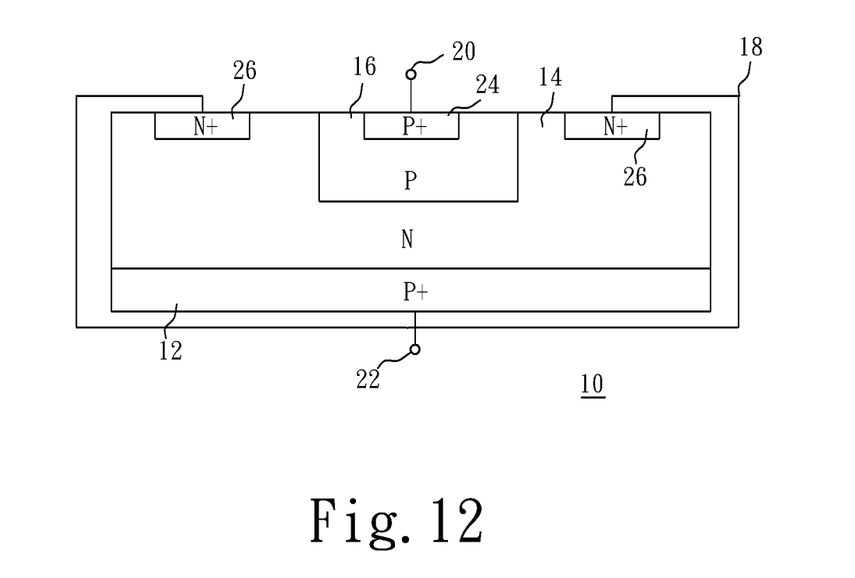
FIG. 12 is a cross-sectional view of a vertical bipolar transistor device according to the eleventh embodiment of the present invention.

FIG. 12 is a cross-sectional view of a vertical bipolar transistor device according to the eleventh embodiment of the present invention. The eleventh embodiment is different from the second embodiment in the conductivity types. The first conductivity type and the second conductivity type of the eleventh embodiment are respectively a P type and an N type. The other structures of the eleventh embodiment have been described in the second embodiment so will not be reiterated.

When positive ESD energy is applied to the second pin 22 and the first pin 20 is grounded, the ESD current flows from the second pin 22 to the first pin 20 through the heavily-doped semiconductor substrate 12, the first semiconductor epitaxial layer 14, the first doped well 16, and the first heavily-doped area 24. Since the second heavily-doped area 26, the first semiconductor epitaxial layer 14 and the heavily-doped semiconductor substrate 12 have the same voltage due to the external conductor 18, the electric field is uniformly distributed on the entire breakdown interface between the first doped well 16 and the first semiconductor epitaxial layer 14, which reduces the current crowding effect occurring at the corner of the first doped well 16.

Figure 13:
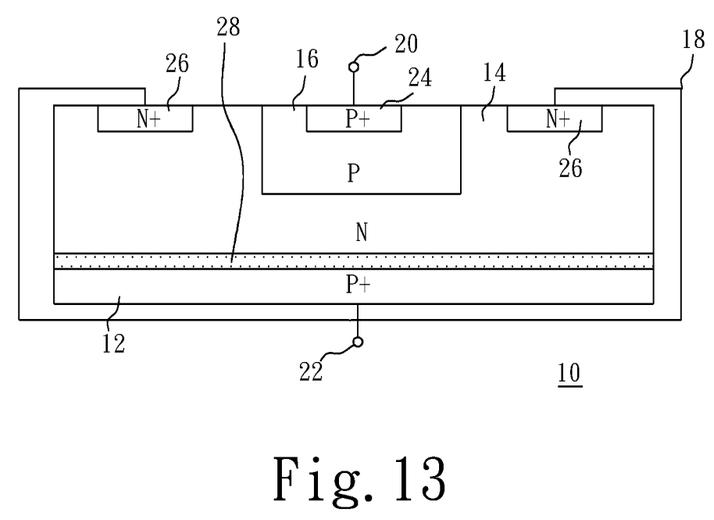
FIG. 13 is a cross-sectional view of a vertical bipolar transistor device according to the twelfth embodiment of the present invention.

FIG. 13 is a cross-sectional view of a vertical bipolar transistor device according to the twelfth embodiment of the present invention. The twelfth embodiment is different from the third embodiment in the conductivity types. The first conductivity type and the second conductivity type of the twelfth embodiment are respectively a P type and an N type. It is noted that heavily-doped buried layer 28 is used when positive ESD energy is applied to the first pin 20 and the second pin 22 is grounded. The other structures of the ninth embodiment have been described in the third embodiment so will not be reiterated.

When positive ESD energy is applied to the second pin 22 and the first pin 20 is grounded, the ESD current flows from the second pin 22 to the first pin 20 through the heavily-doped semiconductor substrate 12, the heavily-doped buried layer 28, the first semiconductor epitaxial layer 14, the first doped well 16, and the first heavily-doped area 24. Since the second heavily-doped area 26, the first semiconductor epitaxial layer 14 and the heavily-doped semiconductor substrate 12 have the same voltage due to the external conductor 18, the electric field is uniformly distributed on the entire breakdown interface between the first doped well 16 and the first semiconductor epitaxial layer 14, which reduces the current crowding effect occurring at the corner of the first doped well 16.

When positive ESD energy is applied to the first pin 20 and the second pin 22 is grounded, two ESD current flows from the first pin 20 to the second pin 22 to enhance the ESD level. One ESD current flows from the first pin 20 to the second pin 22 through the first heavily-doped area 24, the first doped well 16, the first semiconductor epitaxial layer 14, the heavily-doped buried layer 28, and the heavily-doped semiconductor substrate 12. The other ESD current flows from the first pin 20 to the second pin 22 through the first heavily-doped area 24, the first doped well 16, the first semiconductor epitaxial layer 14, the second heavily-doped area 26, and the external conductor 18.

Figure 14:
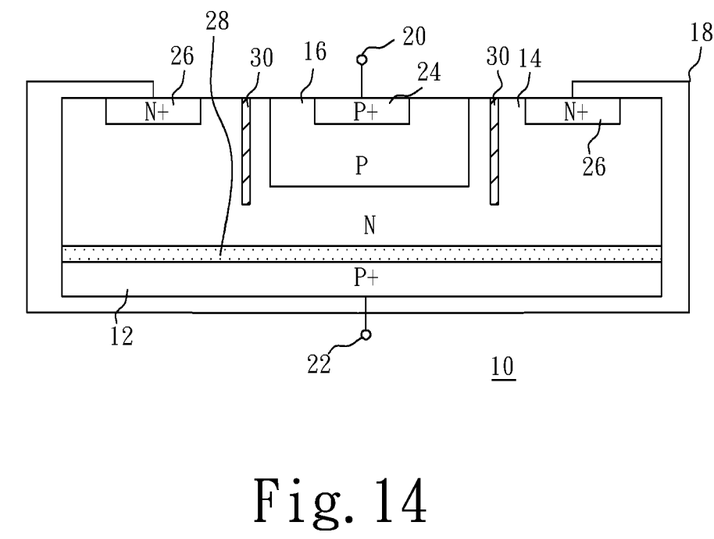
FIG. 14 is a cross-sectional view of a vertical bipolar transistor device according to the thirteenth embodiment of the present invention.

FIG. 14 is a cross-sectional view of a vertical bipolar transistor device according to the thirteenth embodiment of the present invention. The thirteenth embodiment is different from the fourth embodiment in the conductivity types. The first conductivity type and the second conductivity type of the thirteenth embodiment are respectively a P type and an N type. For achieving good heat dissipation, the isolation structure 30 is used to prevent the ESD current from flowing along the top surface of the first semiconductor epitaxial layer 14 when positive ESD energy is applied to the first pin 20 and the second pin 22 is grounded. When the positive ESD energy is applied to the first pin 20 and the second pin 22 is grounded, the ESD current flows under the isolation structure 30. As a result, the bottom of the isolation structure 30 is equal to or lower than that of the first doped well 16. In addition, the isolation structure 30 surrounds the first doped well 16. Thus, the ESD current is confined in a space surrounded by the isolation structure 30 when the positive ESD energy is applied to the second pin 22 and the first pin 20 is grounded. The other structures of the thirteenth embodiment have been described in the fourth embodiment so will not be reiterated.

Figure 15:
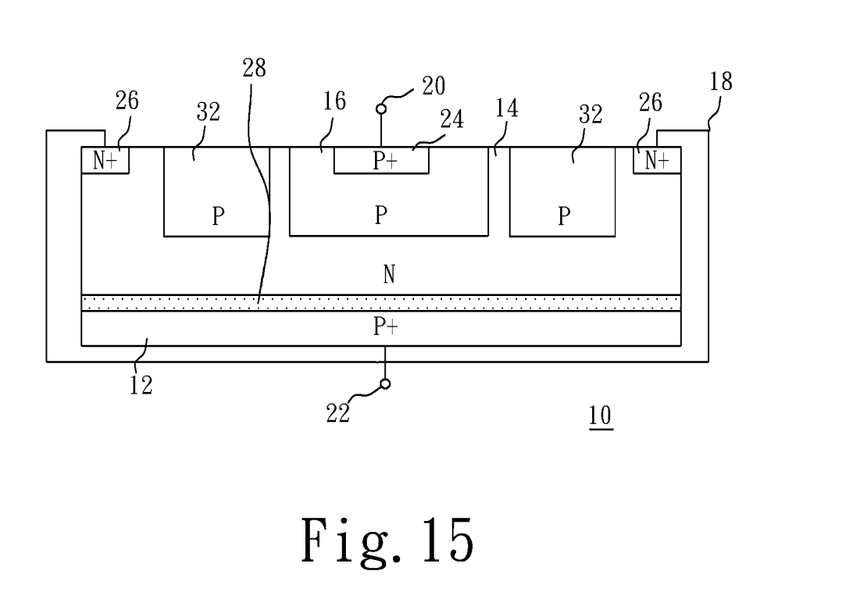
FIG. 15 is a cross-sectional view of a vertical bipolar transistor device according to the fourteenth embodiment of the present invention.

FIG. 15 is a cross-sectional view of a vertical bipolar transistor device according to the fourteenth embodiment of the present invention. The fourteenth embodiment is different from the fifth embodiment in the conductivity types. The first conductivity type and the second conductivity type of the fourteenth embodiment are respectively a P type and an N type. For achieving good heat dissipation, the second doped well 32 is used to prevent the ESD current from flowing along the top surface of the first semiconductor epitaxial layer 14 when positive ESD energy is applied to the first pin 20 and the second pin 22 is grounded. When the positive ESD energy is applied to the first pin 20 and the second pin 22 is grounded, the ESD current flows under the second doped well 32. As a result, the bottom of the second doped well 32 is equal to or lower than that of the first doped well 16. In addition, the second doped well 32 surrounds the first doped well 16. Thus, the ESD current is confined in a space surrounded by the second doped well 32 when the positive ESD energy is applied to the second pin 22 and the first pin 20 is grounded. The other structures of the fourteenth embodiment have been described in the fifth embodiment so will not be reiterated.

Figure 16:
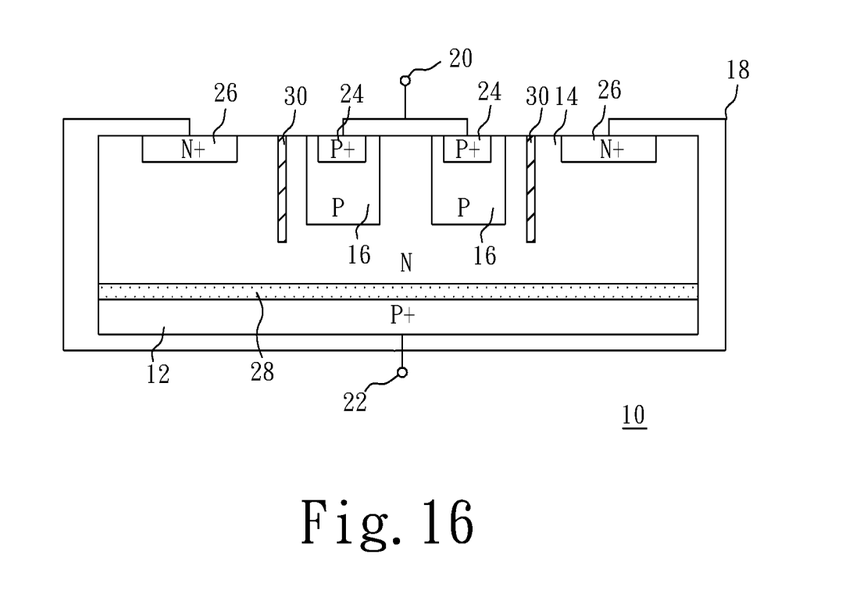
FIG. 16 is a cross-sectional view of a vertical bipolar transistor device according to the fifteenth embodiment of the present invention.

FIG. 16 is a cross-sectional view of a vertical bipolar transistor device according to the fifteenth embodiment of the present invention. The fifteenth embodiment is different from the sixth embodiment in the conductivity types. The first conductivity type and the second conductivity type of the fifteenth embodiment are respectively a P type and an N type. The other structures of the fifteenth embodiment have been described in the sixth embodiment so will not be reiterated.

Figure 17:
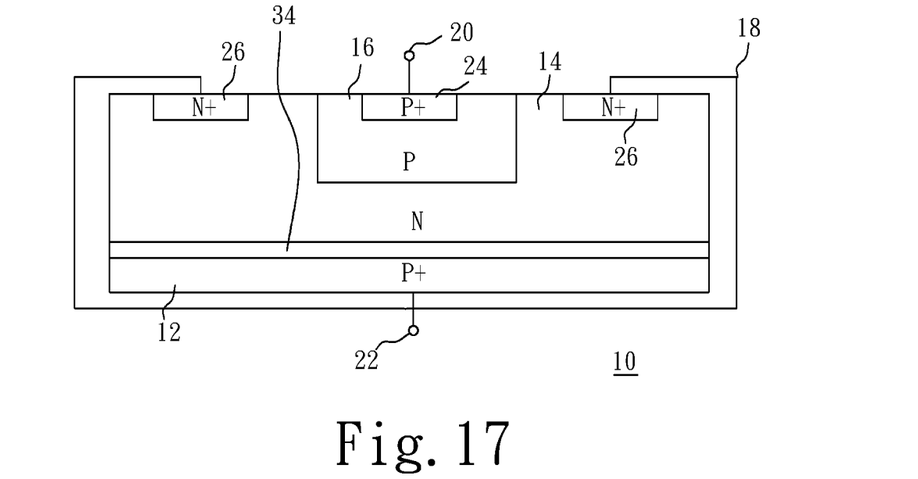
FIG. 17 is a cross-sectional view of a vertical bipolar transistor device according to the sixteenth embodiment of the present invention.

FIG. 17 is a cross-sectional view of a vertical bipolar transistor device according to the sixteenth embodiment of the present invention. The sixteenth embodiment is different from the seventh embodiment in the conductivity types. The first conductivity type and the second conductivity type of the sixteenth embodiment are respectively a P type and an N type. The other structures of the sixteenth embodiment have been described in the seventh embodiment so will not be reiterated.

Figure 18:
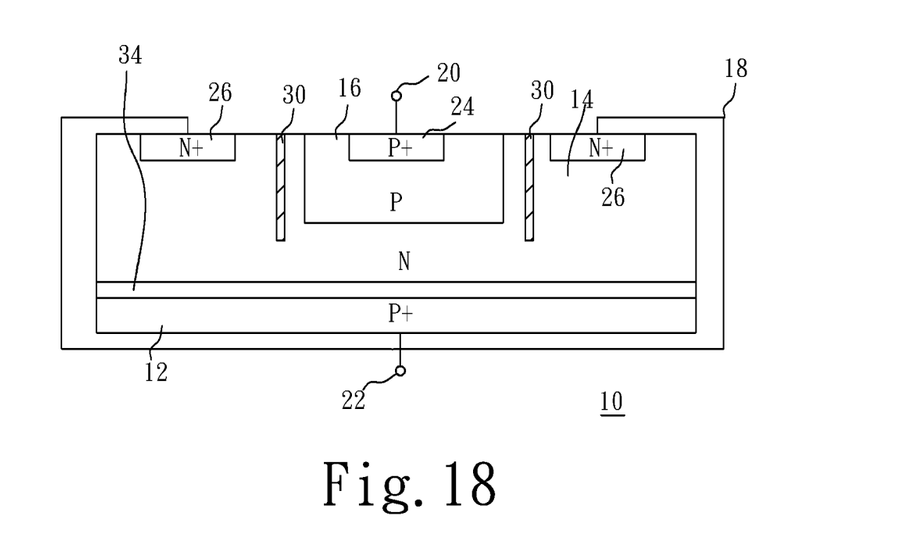
FIG. 18 is a cross-sectional view of a vertical bipolar transistor device according to the seventeenth embodiment of the present invention.

FIG. 18 is a cross-sectional view of a vertical bipolar transistor device according to the seventeenth embodiment of the present invention. The seventeenth embodiment is different from the eighth embodiment in the conductivity types. The first conductivity type and the second conductivity type of the seventeenth embodiment are respectively a P type and an N type. The other structures of the seventeenth embodiment have been described in the eighth embodiment so will not be reiterated.

Figure 19:
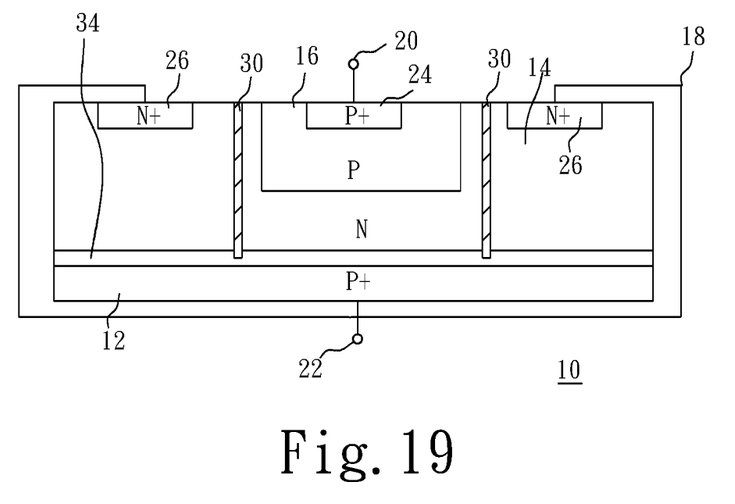
FIG. 19 is a cross-sectional view of a vertical bipolar transistor device according to the eighteenth embodiment of the present invention.

FIG. 19 is a cross-sectional view of a vertical bipolar transistor device according to the eighteenth embodiment of the present invention. The eighteenth embodiment is different from the ninth embodiment in the conductivity types. The first conductivity type and the second conductivity type of the eighteenth embodiment are respectively a P type and an N type. The other structures of the eighteenth embodiment have been described in the ninth embodiment so will not be reiterated.

According to the embodiments provided above, the vertical bipolar transistor device can adjust a gain and a breakdown voltage based on the resistivity and the thickness of the first semiconductor epitaxial layer. The vertical bipolar transistor device may have a larger range of the breakdown voltage based on the resistivity of the first semiconductor epitaxial layer and the heavily-doped buried layer.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A vertical bipolar transistor device comprising:
   a heavily-doped semiconductor substrate having a first conductivity type;
   a first semiconductor epitaxial layer, having a second conductivity type, formed on the heavily-doped semiconductor substrate, the second conductivity type being opposite to the first conductivity type;
   at least one first doped well, having the first conductivity type, formed in the first semiconductor epitaxial layer; and
   an external conductor formed of a metallic material and arranged outside the heavily-doped semiconductor substrate and the first semiconductor epitaxial layer and directly electrically connected to the heavily-doped semiconductor substrate and the first semiconductor epitaxial layer.

2. The vertical bipolar transistor device according to claim 1, wherein the first conductivity type is an N type and the second conductivity type is a P type.

3. The vertical bipolar transistor device according to claim 1, wherein the first conductivity type is a P type and the second conductivity type is an N type.

4. The vertical bipolar transistor device according to claim 1, further comprising:
   at least one first heavily-doped area, having the first conductivity type, formed in the at least one first doped well; and
   a second heavily-doped area, having the second conductivity type, formed in the first semiconductor epitaxial layer, wherein the second heavily-doped area surrounds the at least one first doped well.

5. The vertical bipolar transistor device according to claim 4, further comprising a heavily-doped buried layer formed between the heavily-doped semiconductor substrate and the first semiconductor epitaxial layer and under the at least one first doped well.

6. The vertical bipolar transistor device according to claim 5, wherein the at least one first doped well comprises a plurality of first doped wells, the at least one first heavily-doped area comprises a plurality of first heavily-doped areas, and the plurality of first heavily-doped areas are respectively formed in the plurality of first doped wells.

7. The vertical bipolar transistor device according to claim 5, further comprising
an isolation structure formed in the first semiconductor epitaxial layer and between the at least one first doped well and the second heavily-doped area, the isolation structure surrounds the at least one first doped well, and
a first distance between a bottom of the isolation structure and the heavily-doped semiconductor substrate is equal to or smaller than a second distance between a bottom of the at least one first doped well and the heavily-doped semiconductor substrate.

8. The vertical bipolar transistor device according to claim 5, further comprising a second doped well formed in the first semiconductor epitaxial layer and between the at least one first doped well and the second heavily-doped area, the second doped well has the first conductivity type, the second doped well surrounds the at least one first doped well, and a bottom of the second doped well is equal to or lower than that of the at least one first doped well.

9. The vertical bipolar transistor device according to claim 1, wherein the first doped well is electrically connected a first pin and the heavily-doped semiconductor substrate, the external conductor, and the first semiconductor epitaxial layer are electrically connected to a second pin.

10. The vertical bipolar transistor device according to claim 1, wherein the external conductor comprises a lead-frame and welding wires.

11. The vertical bipolar transistor device according to claim 4, further comprising a second semiconductor epitaxial layer formed between the heavily-doped semiconductor substrate and the first semiconductor epitaxial layer and under the at least one first doped well, and doping concentration of the second semiconductor epitaxial layer is higher than doping concentration of the first semiconductor epitaxial layer.

12. The vertical bipolar transistor device according to claim 11, further comprising an isolation structure formed in the first semiconductor epitaxial layer and between the at least one first doped well and the second heavily-doped area, the isolation structure surrounds the at least one first doped well, and a bottom of the isolation structure is equal to or lower than that of the at least one first doped well.

13. The vertical bipolar transistor device according to claim 12, wherein the isolation structure is formed in the second semiconductor epitaxial layer.

* * * * *